United States Patent
Onizawa (10) Patent No.: US 9,330,905 B2
(45) Date of Patent: May 3, 2016

(54) SEMICONDUCTOR DEVICE AND MANUFACTURING METHOD OF THE SAME

(71) Applicant: Renesas Electronics Corporation, Kawasaki-shi, Kanagawa (JP)

(72) Inventor: Takashi Onizawa, Kanagawa (JP)

(73) Assignee: Renesas Electronics Corporation, Kawasaki-shi, Kanagawa (JP)

(*) Notice: Subject to any disclaimer, the term of this patent is extended or adjusted under 35 U.S.C. 154(b) by 0 days.

(21) Appl. No.: 13/845,666

(22) Filed: Mar. 18, 2013

(65) Prior Publication Data

US 2013/0264576 A1 Oct. 10, 2013

(30) Foreign Application Priority Data

Apr. 4, 2012 (JP) .................. 2012-085459

(51) Int. Cl.
*H01L 29/78* (2006.01)
*H01L 21/02* (2006.01)
*H01L 29/40* (2006.01)
(Continued)

(52) U.S. Cl.
CPC .... *H01L 21/02345* (2013.01); *H01L 21/28264* (2013.01); *H01L 29/401* (2013.01); *H01L 29/517* (2013.01); *H01L 29/66462* (2013.01); *H01L 29/66659* (2013.01); *H01L 29/7787* (2013.01); *H01L 29/78* (2013.01); *H01L 29/7835* (2013.01); *H01L 29/2003* (2013.01);
(Continued)

(58) Field of Classification Search
CPC ............. H01L 29/2003; H01L 29/517; H01L 29/66462; H01L 29/7787; H01L 21/28264

USPC ............................................. 257/76; 438/779
See application file for complete search history.

(56) References Cited

U.S. PATENT DOCUMENTS 5,780,922 A * 7/1998 Mishra et al. .................. 257/616
5,798,555 A * 8/1998 Mishra et al. .................. 257/410
(Continued)

FOREIGN PATENT DOCUMENTS

JP 2005-72490 A 3/2005
JP 2006-253224 A 9/2006
(Continued)

OTHER PUBLICATIONS

Cartier et al., "Passivation and depassivation of silicon dangling bonds at the Si/SiO2 interface by atomic hydrogen", Applied Physics Letters 63, pp. 1510-1512 (1993); doi: 10.1063/1.110758.*
(Continued)

*Primary Examiner* — Marvin Payne
*Assistant Examiner* — Victor Barzykin
(74) *Attorney, Agent, or Firm* — McGinn IP Law Group, PLLC (57) ABSTRACT

A semiconductor device, in which the generation of interface states in the interface region between a nitride semiconductor layer and an aluminum oxide layer is suppressed, includes a first nitride semiconductor layer and an aluminum oxide layer. The first nitride semiconductor layer includes Ga. The aluminum oxide layer directly contacts the upper surface of the first nitride semiconductor layer, and includes H (hydrogen) atoms at least within a defined region from the interface with the first nitride semiconductor layer. In addition, the peak value of an H atom concentration in the above region is in a range of $1 \times 10^{20}$ cm$^{-3}$ to $5 \times 10^{21}$ cm$^{-3}$.

17 Claims, 9 Drawing Sheets

(51) Int. Cl.
  *H01L 29/51* (2006.01)
  *H01L 29/66* (2006.01)
  *H01L 29/778* (2006.01)
  *H01L 21/28* (2006.01)
  *H01L 29/20* (2006.01)
  *H01L 29/417* (2006.01)

(52) U.S. Cl.
  CPC ......... *H01L 29/402* (2013.01); *H01L 29/41766* (2013.01)

(56) References Cited

U.S. PATENT DOCUMENTS

| | | | |
|---|---|---|---|
| 5,872,031 A * | 2/1999 | Mishra et al. | 438/216 |
| 8,133,787 B2 | 3/2012 | Endo | |
| 2008/0087915 A1* | 4/2008 | Uemoto et al. | 257/192 |
| 2008/0203441 A1 | 8/2008 | Endo | |
| 2008/0290393 A1* | 11/2008 | Kakehata et al. | 257/316 |
| 2011/0193095 A1 | 8/2011 | Nakata et al. | |
| 2012/0091522 A1 | 4/2012 | Ozaki et al. | |
| 2012/0217544 A1* | 8/2012 | Ohki | 257/194 |
| 2012/0241737 A1* | 9/2012 | Imoto et al. | 257/43 |
| 2013/0075719 A1* | 3/2013 | Nakano et al. | 257/43 |
| 2013/0099245 A1* | 4/2013 | Ando et al. | 257/76 |
| 2013/0292699 A1* | 11/2013 | Ueno et al. | 257/76 |

FOREIGN PATENT DOCUMENTS

| | | |
|---|---|---|
| JP | 2006-269641 A | 10/2006 |
| JP | 2008-244456 A | 10/2008 |
| JP | 2010-098076 A | 4/2010 |
| JP | 2010-98141 A | 4/2010 |
| JP | 2012-089677 A | 5/2012 |
| WO | WO 2011118099 A1 * | 9/2011 |

OTHER PUBLICATIONS

Medjdoub et al., "Characteristics of Al2O3/AlInN/GaN MOSHEMT", Electronics letters, vol. 43, 12 (2007).*
Shacham-Diamand et al., The Electrical Properties of Ion-Implanted Amorphous Silicon Programmable Element in the Unprogrammed State, IEEE Trans. Electron Devices, vol. 37, pp. 159-167 (1990).*
Japanese Office Action dated Jan. 26, 2016 with an English translation thereof.

* cited by examiner

SEMICONDUCTOR DEVICE AND MANUFACTURING METHOD OF THE SAME

CROSS-REFERENCE TO RELATED APPLICATIONS

The disclosure of Japanese Patent Application No. 2012-085459 filed on Apr. 4, 2012 including the specification, drawings and abstract is incorporated herein by reference in its entirety.

BACKGROUND

The present invention relates to semiconductor devices and semiconductor device manufacturing methods.

In order to improve the characteristics of semiconductor devices, various technologies relating to the laminated structures of gate insulating films and semiconductor layers have been disclosed.

The patent literature 1 (Japanese Unexamined Patent Application Publication No. 2006-269641) discloses the following semiconductor device. The semiconductor device includes a P-channel MOSFET (Metal Oxide Semiconductor Field Effect Transistor) in which SiC is used. The P-channel MOSFET has a gate oxide film made of $SiO_2$, and the gate oxide film includes hydrogen atoms or hydroxyl groups with their concentrations in a range of $1\times10^{19}$ $cm^{-3}$ to $1\times10^{22}$ $cm^{-3}$. In addition, the patent literature 1 discloses that, after an oxide film is formed, the gate oxide film is formed by thermally oxidizing the oxide film in an atmosphere including $H_2O$.

The patent literature 2 (Japanese Unexamined Patent Application Publication No. 2008-244456) discloses the following semiconductor device including SiC. A hydrogen concentration at an interface region between a channel region and a gate insulating film of the semiconductor device is $4.7\times10^{20}$ $cm^{-3}$ or larger. In addition, in the patent literature 2, dangling bonds at the interface region are assumed to be hydrogen-terminated or hydroxyl-terminated.

The patent literature 3 (Japanese Unexamined Patent Application Publication No. 2005-72490) discloses a forming method of a dielectric film. In the paragraph 0007 of the patent literature 3, it is described that, if an aluminum oxide film is formed by means of an atomic layer CVD method (referred to as an ALD method hereinafter) with the use of trimethyl aluminum (TMA) and water as materials, hydrogen atoms are included in the aluminum oxide film with their concentration in a range of $1\times10^{20}$ $cm^{-3}$ to $1\times10^{21}$ $cm^{-3}$ as component elements of hydroxyl groups. In addition, this patent literature states that the above description relates to a gate insulating film of a silicon transistor. It is alleged that the above described hydroxyl groups in a silicon transistor are apt to be desorbed in the following post-process, and that the characteristics of the semiconductor are adversely affected.

The patent literature 4 (Japanese Unexamined Patent Application Publication No. 2010-98141) discloses that a gate insulating film made of aluminum oxide is formed by means of the ALD (Atomic Layer Deposition) method with the use of TMA, and $O_2$ or $O_3$ over a GaN semiconductor layer.

The patent literature 5 (Japanese Unexamined Patent Application Publication No. 2006-253224) discloses that, in a nitride semiconductor device, hydrogen atoms are segregated not in a gate insulating film, but in a channel region of a group III nitride semiconductor layer which is doped with Mg.

SUMMARY

If an aluminum oxide layer is formed over a nitride semiconductor layer including Ga, many interface states are generated in the interface region between the aluminum oxide layer and the nitride semiconductor layer. In this case, the characteristics of the semiconductor device are deteriorated. Other problems of the related arts and new features of the present invention will be revealed in accordance with the description of the present invention and the accompanying drawings hereinafter.

According to an aspect of the present invention, a semiconductor device includes a first nitride semiconductor layer and an aluminum oxide layer. The aluminum oxide layer directly contacts the upper surface of the first nitride semiconductor layer, and includes H (hydrogen) atoms at least within a defined region from the interface with the first nitride semiconductor layer. In addition, the peak value of an H atom concentration in the above region is in a range of $1\times10^{20}$ $cm^{-3}$ to $5\times10^{21}$ $cm^{-3}$.

According to another aspect of the present invention, a semiconductor device manufacturing method includes the following processes: a first process is a process of forming an aluminum oxide layer including H atoms over a first nitride semiconductor layer including Ga (an insulating film forming process), and a second process is a process of carrying out a heat treatment under an atmosphere where there is no oxidant gas (a heat treatment process).

According to the aspects of the present invention, a semiconductor device, in which the generation of interface states in the interface region between the nitride semiconductor layer and the aluminum oxide layer is suppressed, can be provided.

DETAILED DESCRIPTION

Hereinafter, the embodiments of the present invention will be described with reference to the accompanying drawings. In addition, the same components are given the same reference numerals, and redundant description will be omitted accordingly.

First Embodiment

The configuration of a semiconductor device according to a first embodiment will be described with reference to FIG. 1 and FIG. 3. This semiconductor device includes a first nitride semiconductor layer NL1 and an aluminum oxide layer IL. The first nitride semiconductor layer NL1 includes Ga. The aluminum oxide layer IL directly contacts the upper surface of the first nitride semiconductor layer NL1, and includes H (hydrogen) atoms at least within a defined region from the interface with the first nitride semiconductor layer NL1. In addition, the peak value of an H atom concentration in the above region is in a range of $1 \times 10^{20}$ cm$^{-3}$ to $5 \times 10^{21}$ cm$^{-3}$.

The inventors of the present invention discovered that, by causing the aluminum oxide layer IL over the first nitride semiconductor layer NL1 to include H atoms with a predefined H atom concentration, the generation of interface states in the interface region between the nitride semiconductor layer NL1 and the aluminum oxide layer IL could be suppressed. The details of the above will be described hereinafter.

Figure 1:
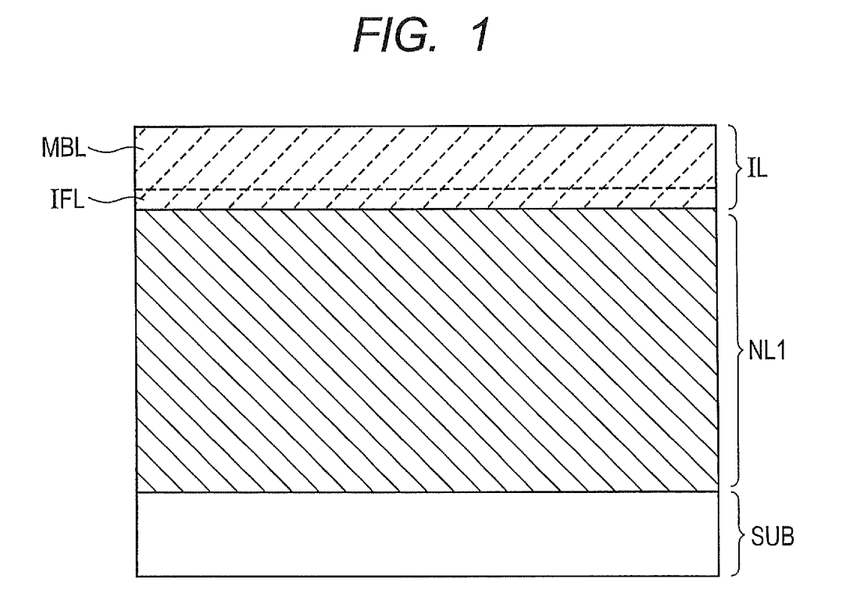
FIG. 1 is a cross-section view showing the configuration of a semiconductor device according to a first embodiment.

FIG. 1 is a cross-section view showing the configuration of a semiconductor device according to a first embodiment. As shown in FIG. 1, for example, the first nitride semiconductor layer NL1 is formed over a substrate SUB. The substrate SUB is a substrate for supporting the first nitride semiconductor layer NL1. The substrate SUB is, for example, a silicon substrate. Alternatively, the substrate SUB can be a GaN substrate or a sapphire substrate. In addition, the substrate SUB can be omitted. A buffer layer (not shown) can be formed between the substrate SUB and the first nitride semiconductor layer NL1.

The first nitride semiconductor layer NL1 includes a group III nitride semiconductor. To put it concretely, the first nitride semiconductor layer NL1 is a GaN layer, an AlGaN layer, or an AlInGaN layer. Because the first nitride semiconductor layer NL1 are formed at least by one of these materials, advantageous effects of the first embodiment can be obtained.

The aluminum oxide layer IL directly contacts the upper surface of the first nitride semiconductor layer NL1. The aluminum oxide layer IL includes a predefined amount of H atoms. In the first embodiment, the aluminum oxide layer IL includes, for example, an interface layer IFL and a main body layer MBL.

Figure 3:
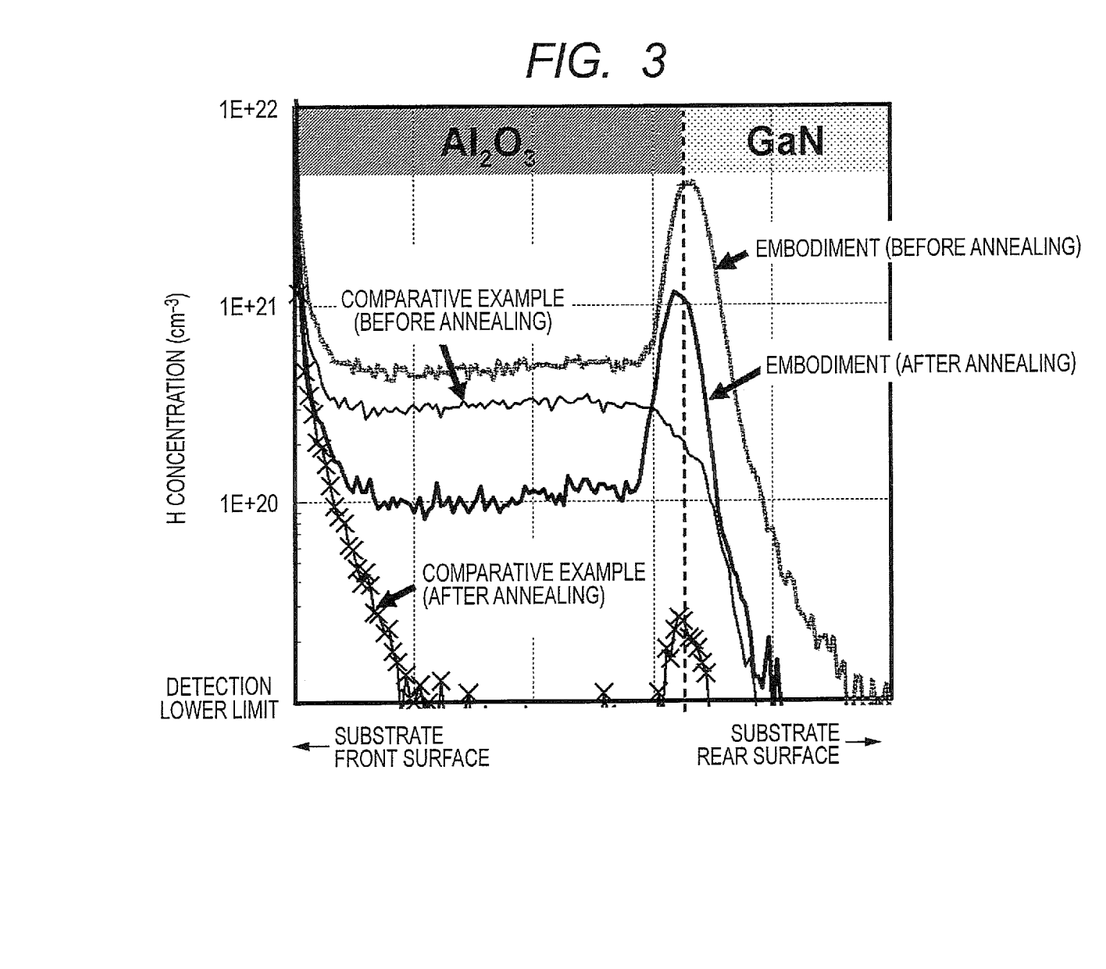
FIG. 3 is a diagram showing H atom concentration profiles.

In FIG. 3, the H atom concentration of the aluminum oxide layer IL of the first embodiment will be explained by contrast with that of a comparative example. FIG. 3 is a diagram showing H atom concentration profiles. Here, the H atom concentration profiles shown in FIG. 3 are measured with the use of SIMS (Secondary Ion Mass Spectrometry).

In FIG. 3, an aluminum oxide layer IL of the comparative example is formed without the layer IL being doped with H atoms. On the other hand, the aluminum oxide layer IL of the first embodiment is formed in an after-mentioned insulating film forming process with the layer IL being doped, for example, with H$_2$O. Here, "annealing" in FIG. 3 denotes a kind of heat treatment process described later.

H atoms growing out of hydrocarbons included in raw materials of Al are detected in the aluminum oxide layer IL of the comparative example before annealing. In the aluminum oxide layer IL of the comparative example before annealing, an H atom is bound to a C (carbon).

In the aluminum oxide layer IL of the comparative example after annealing, the H atom concentration is decreased owing to the heat treatment compared with before the annealing. In other words, in the aluminum oxide layer IL of the comparative example, hydrocarbons are desorbed by the heat treatment, and the H atom concentration is more decreased than before the annealing. The H atom concentration in the aluminum oxide layer IL of the comparative example after the annealing is below $1 \times 10^{20}$ cm$^{-3}$ at a maximum.

The comparative example has many interface states in the interface region between the first nitride semiconductor layer NL1 and the aluminum oxide layer IL regardless whether the comparative example has been subjected to the annealing or not. Therefore, there is a possibility that the characteristics of the semiconductor device are deteriorated.

On the other hand, the H atom concentration in the aluminum oxide layer IL of the first embodiment before the annealing is, for example, $1 \times 10^{20}$ cm$^{-3}$ or larger.

In the first embodiment, it is preferable to use the aluminum oxide layer IL after the annealing for the semiconductor device. The aluminum oxide layer IL after the annealing includes H (hydrogen) atoms at least within a defined region from the interface with the first nitride semiconductor layer NL1. In addition, the peak value of an H atom concentration in the above region is in a range of $1 \times 10^{20}$ cm$^{-3}$ to $5 \times 10^{21}$ cm$^{-3}$. It is more preferable that the peak value of the H atom concentration is in a range of $3 \times 10^{20}$ cm$^{-3}$ to $5 \times 10^{21}$ cm$^{-3}$.

As shown in FIG. 3, the H atoms in the aluminum oxide IL of the first embodiment after the annealing are segregated near to the interface in a cross-section view. The aluminum oxide layer IL of the first embodiment after the annealing includes an interface layer IFL and a main body layer MBL. The interface layer IFL directly contacts the first nitride semiconductor layer NL1, and has the peak of the H atom concentration. The interface layer IFL is overlaid with the main body layer MBL, and the H atom concentration in the main body layer MBL is lower than that in the interface layer IFL. Because the interface layer IFL includes at least a predefined amount of H atoms, the generation of interface states in the interface region between the first nitride semiconductor layer NL1 and the aluminum oxide layer IL can be suppressed.

In addition, the film thickness of the interface layer IFL is in a range of 1 nm to 10 nm from an interface between the interface layer IFL and the first nitride semiconductor NL1. It is more preferable that the film thickness of the interface layer IFL is in a range of 2 nm to 8 nm. In addition, it is not always required for the interface to be formed between the interface layer IFL and the main body layer MBL. In other words, there is no problem if the peak value of the H atom concentration in the above-predefined region from the interface is in a range of $1 \times 10^{20}$ cm$^{-3}$ to $5 \times 10^{21}$ cm$^{-3}$.

As shown in FIG. 3, in the first embodiment, the peak value of the H atom concentration in the interface layer IFL can be more than double the peak value of an H atom concentration in the main body layer MBL.

In addition, the aluminum oxide IL has Al atoms as tetracoordinated Al atoms in which each Al atom is surrounded by four O atoms and 6-coordinated Al atoms in which each Al atom is surrounded by six O atoms especially in an interface region with the first nitride semiconductor layer NL1 within the interface layer IFL.

The above-mentioned interface region within the interface layer IFL is, for example, 1.5 nm apart at a maximum from the interface between the interface layer IFL and the first nitride semiconductor layer NL1. However, it is all right that the interface region is 3 nm apart at a maximum from the interface between the interface layer IFL and the first nitride semiconductor layer NL1, or is the thickness of 2 atomic layers or the thickness of 3 atomic layers apart at a maximum from the interface between the interface layer IFL and the first nitride semiconductor layer NL1. In addition, in the interface region, tetracoordinated Al atoms account in a range of 30 atomic percent to 50 atomic percent to the total number of Al atoms, and it is more preferable that tetracoordinated Al atoms account in a range of 35 atomic percent to 45 atomic percent. In the interface region, for example, $\gamma Al_2O_3$ accounts more than 90 atomic percent. However, it is all right that the interface region includes other crystal structures (including amorphous states to be later described).

In addition, the aluminum oxide layer IL includes amorphous states. In other words, the half-value width of the diffractive peak of the aluminum oxide layer IL is wider than that of monocrystal $Al_2O_3$. The relative permittivity (k value) of amorphous aluminum oxide is, for example, in a range of 6 to 8. On the other hand, the relative permittivity of crystalline aluminum oxide is 8.5 or more.

If the aluminum oxide layer IL is crystalline, there is a possibility that the number of carrier leak routes will increase in the aluminum oxide layer IL. In other words, there is a possibility that the amount of leak currents will increase. In addition, if the aluminum oxide layer IL is crystalline, there is a possibility that stresses on the first nitride semiconductor layer NL1 will increase. There is a possibility that such stresses will increase the number of the above-mentioned interface states.

On the other hand, owing to the aluminum oxide layer IL being amorphous, the generation of the carrier leak routes can be suppressed. In addition, the stresses on the first nitride semiconductor layer NL1 can be suppressed.

In addition, in the first embodiment, at least part of the H atoms is introduced as hydroxyl groups. The number of hydroxyl groups in the aluminum oxide layer IL is larger than the number of Al—H bonds. In addition, the number of hydroxyl groups included in the aluminum oxide layer IL is at least larger than that of hydrocarbon groups growing out of raw materials of Al. H atoms growing out of hydrocarbons in raw materials of Al are detected in the aluminum oxide layer IL of the comparative example before the annealing, while the situation is obviously different in the aluminum oxide layer IL of the first embodiment. As described later, this is because the raw materials including O (oxygen) atoms and H atoms are used in the insulating film forming process in the first embodiment. As a result, especially the number of interface states in the interface region between the first nitride semiconductor layer NL1 and the aluminum oxide layer IL can be decreased.

The total film thickness of the aluminum oxide layer IL is determined on the basis of the voltage specification of the semiconductor device. For example, the film thickness of the aluminum oxide layer IL is, for example, in a range of 10 nm to 150 nm. To put it concretely, in order to withstand a gate voltage of 10 V, it is necessary for the thickness of the aluminum oxide layer IL to be 50 nm or more. In addition, in order to withstand a gate voltage of 20 V, it is necessary for the thickness of the aluminum oxide layer IL to be 100 nm or more. By properly determining the thickness of the aluminum oxide layer IL, Fowler Nordheim currents and Poole Frenkel currents can be suppressed.

The H atom concentration profile of the aluminum oxide layer IL of the first embodiment shown in FIG. 1 is an example, and the H atom concentration profile of the aluminum oxide layer IL is not limited to this type. As another type of the H atom concentration profile, a type of the H atom concentration in which H atoms uniformly distribute in the aluminum oxide layer IL is conceivable. The distribution of the H atom concentration can be controlled by conditions set in an after-described insulating film forming process and a heat treatment process.

As long as the semiconductor device according to the first embodiment includes the above-described aluminum oxide layer IL, there is no restriction on the types of semiconductor devices. The semiconductor device can be not only an after-mentioned FET (Field Effect Transistor), but also other active devices such as a diode.

Figure 2A:
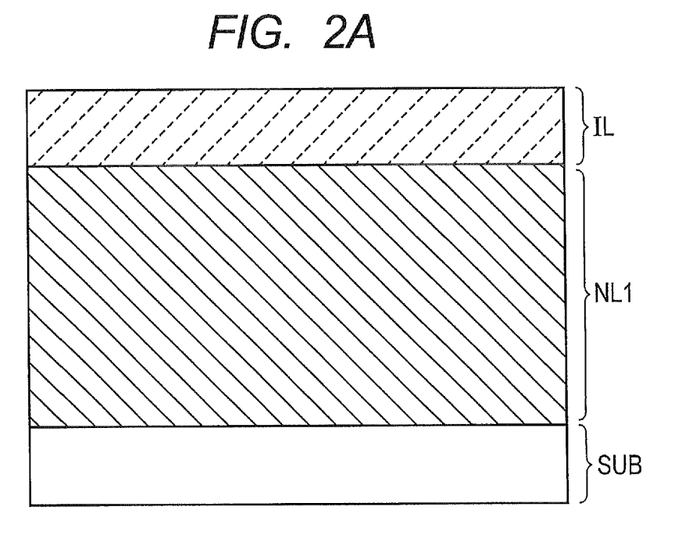
FIG. 2A and FIG. 2B are cross-section views showing a semiconductor device manufacturing method according to the first embodiment.
Figure 2B:
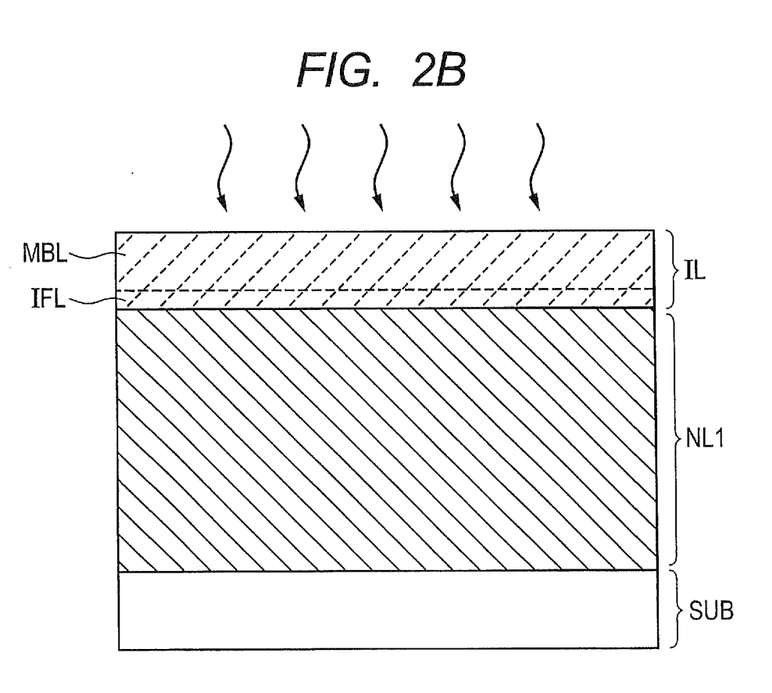

Next, a semiconductor device manufacturing method according to the first embodiment will be described with reference to FIG. 1 to FIG. 3. FIG. 2A and FIG. 2B are cross-section views showing the semiconductor device manufacturing method according to the first embodiment. The semiconductor device manufacturing method of the first embodiment includes the following processes: a first step is a step of forming an aluminum oxide layer IL including H atoms over a first nitride semiconductor layer NL1 including Ga (an insulating film forming process), and a second process is a process of carrying out a heat treatment under an atmosphere where there is no oxidant gas (a heat treatment process). Hereinafter, the details of the semiconductor device manufacturing method will be described.

As shown in FIG. 2A, the first nitride semiconductor layer NL1 is epitaxially grown over the substrate SUB. Next, the surface of the first nitride semiconductor layer NL1 is cleaned with chemicals such as hydrochloric acid.

Next, the aluminum oxide layer IL including H atoms is formed over the first nitride semiconductor layer NL1 including Ga (the insulating film forming process). For example, the aluminum oxide layer IL is formed by means of an ALD (Atomic Layer Deposition) method. One of raw materials of AL is, for example, TMA (trimethyl aluminum).

In the insulating film forming process, the aluminum oxide layer IL is doped with H atoms. Here, as a method to introduce H atoms into a film such as an $SiO_2$ film, it is conceivable that a method in which the $SiO_2$ film is thermally oxidized in a gas atmosphere including H atoms after the $SiO_2$ is formed without doping the film with H atoms like a method described in Japanese Unexamined Patent Application Publication No. 2006-269641. However, the aluminum oxide layer IL has a function to block hydrogen coming externally unlike the $SiO_2$ film. Therefore, as in the case of the first embodiment, by intentionally doping the aluminum oxide layer IL with H atoms, the H atoms can be introduced into the aluminum oxide layer IL.

In addition, a dopant for supplying H atoms includes, for example, O atoms and H atoms. In other words, a raw material for a hydrogen dopant is also a raw material for an oxygen dopant. To put it concretely, the dopant for supplying H atoms is $H_2O$. By using this dopant, doping the aluminum layer IL with H atoms can be stably conducted. In addition, in the insulating film forming process, the amount of the H atom dopant, with which the aluminum oxide layer IL is doped, can be increased at least within a defied region from the interface with the first nitride semiconductor layer NL1. In addition, the H atom dopant and O atom dopant can be used by mixture.

Next, as shown in FIG. 2B, the heat treatment is carried out under an atmosphere where there is no oxidant gas (the heat treatment process). Here, the atmosphere where there is no oxidant gas means an atmosphere having an oxygen partial pressure of $0.2 \times 10^5$ atm or lower. For example, it is a nitrogen gas atmosphere, or an inert gas atmosphere such as an Ar gas atmosphere.

The temperature of the heat treatment is in a range of 500° C. to 900° C. By setting the temperature of the heat treatment 500° C. or larger, the aluminum oxide layer IL can be highly densified. In other words, the number of carrier leak paths can be decreased. On the other hand, if the temperature of the heat treatment is 900° C. or higher, the aluminum oxide becomes crystallized, with the result that many leak paths are generated.

The time period of the heat treatment is, for example, in a range of 1 minute to 30 minutes. The time period of the heat treatment being the above lower limit or longer makes it possible to stably and highly densify the aluminum oxide layer IL. The time period of the heat treatment being shorter than the above upper limit makes it possible to suppress the desorption of H atoms.

In addition, it is necessary that the above-described heat treatment conditions should be set so that the aluminum oxide layer IL may not be crystallized by the heat treatment.

As shown in FIG. 3, the H atom concentration in the aluminum oxide layer IL is decreased by the heat treatment. In this case, H atoms in the aluminum oxide layer IL are emitted outside.

After the above heat treatment, the aluminum oxide layer IL includes H atoms at least within a defined region from the interface with the first nitride semiconductor layer NL1. In addition, the peak value of the H atom concentration in the above region is in a range of $1\times10^{20}$ cm$^{-3}$ to $5\times10^{21}$ cm$^{-3}$.

The amount of dopant flow or the time period of forming the insulating film in the above insulating film forming process, or the heat treatment temperature or the time period of the heat treatment in the above heat treatment process, or the like is adjusted so that the above H atom concentration becomes a predefined value.

Figure 4:
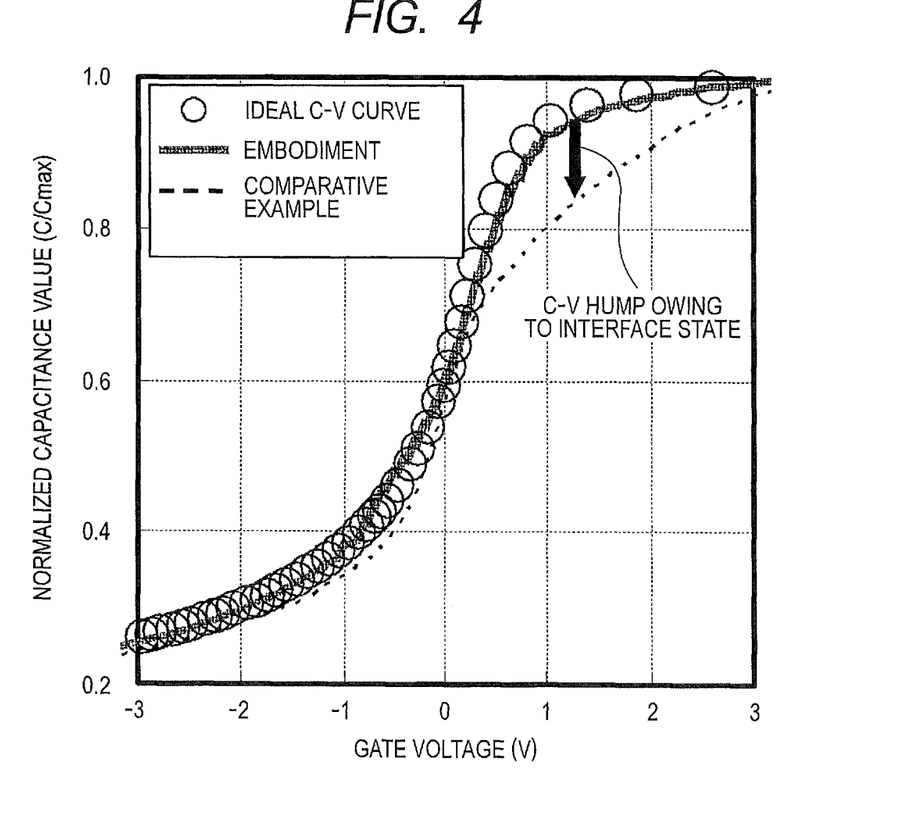
FIG. 4 is a diagram showing an advantageous effect of the first embodiment.
Figure 5:
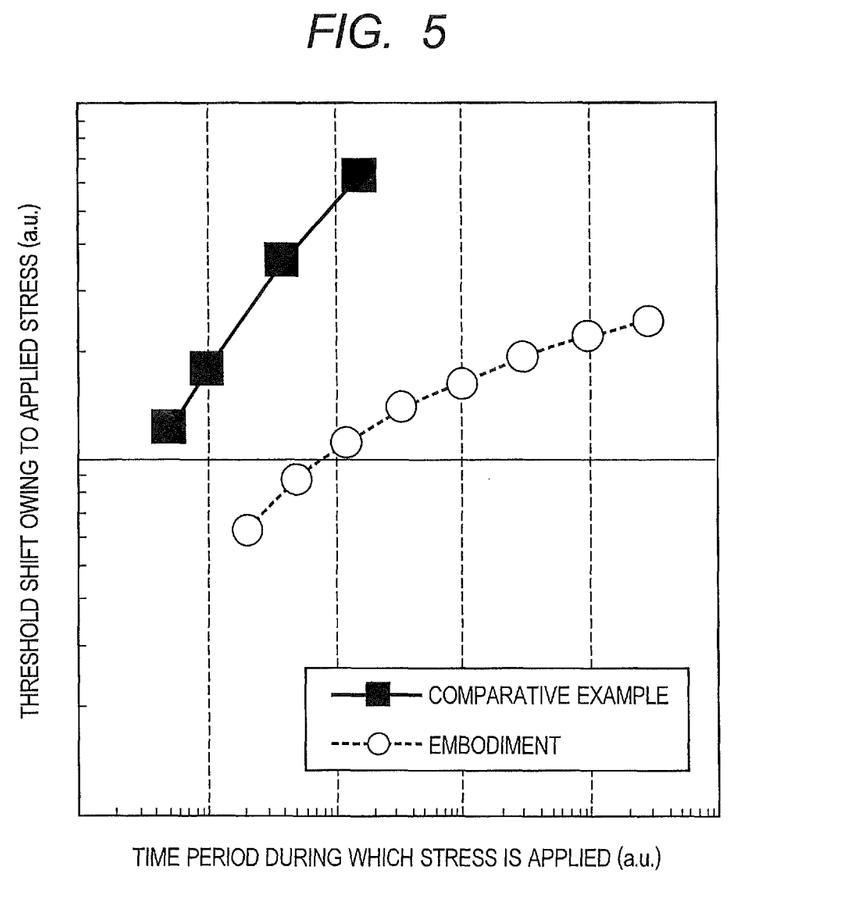
FIG. 5 is a diagram showing an advantageous effect of the first embodiment.

Next, with reference to FIG. 4 and FIG. 5, the operation and advantageous effects of the first embodiment will be described. FIG. 4 and FIG. 5 are diagrams showing the advantageous effects of the first embodiment.

FIG. 4 shows the C-V characteristics (capacitance-voltage characteristics) of both aluminum oxide layers IL of the first embodiment and the comparative example explained with reference to FIG. 3. Here, both C-V characteristics are measured after both aluminum oxide layers IL are annealed. Along with the above two C-V characteristics, an ideal C-V characteristic is shown in FIG. 4. The horizontal axis of FIG. 4 denotes the gate voltage, and the vertical axis denotes the normalized capacitance value.

The C-V characteristic of the comparative example has a C-V hump owing to interface states on the conduction band side. On the other hand, in the first embodiment, because the number of interface states is decreased, an excellent C-V characteristic that is almost equal to the ideal C-V curve is obtained.

FIG. 5 shows BTIs (Bias Temperature Instabilities) obtained when the aluminum oxide layers IL of the first embodiment and the comparative example are used for fabricating FETs. The horizontal axis denotes the time period during which a predefined gate voltage and a high temperature stress are applied, and the vertical axis denoted the shift (degradation) amount of the gate threshold voltage owing to the applied stress.

In the comparative example, the shift amount of the threshold voltage brought about by the applied stress is larger owing to the interface states. On the other hand, in the first embodiment, because the number of interface states is decreased, the shift amount of the threshold voltage owing to the applied stress is several orders of magnitude more improved than the comparative example.

As described above, in the first embodiment, the aluminum oxide layer IL includes H (hydrogen) atoms at least within a defined region from the interface with the first nitride semiconductor layer NL1. In addition, the peak value of the H atom concentration in the above region is in a range of $1\times10^{20}$ cm$^{-3}$ to $5\times10^{21}$ cm$^{-3}$. Thanks to the above facts, a semiconductor device, in which the generation of interface states in the interface region between the nitride semiconductor layer IL and the aluminum oxide layer NL1 is suppressed, can be provided.

Second Embodiment

Figure 6:
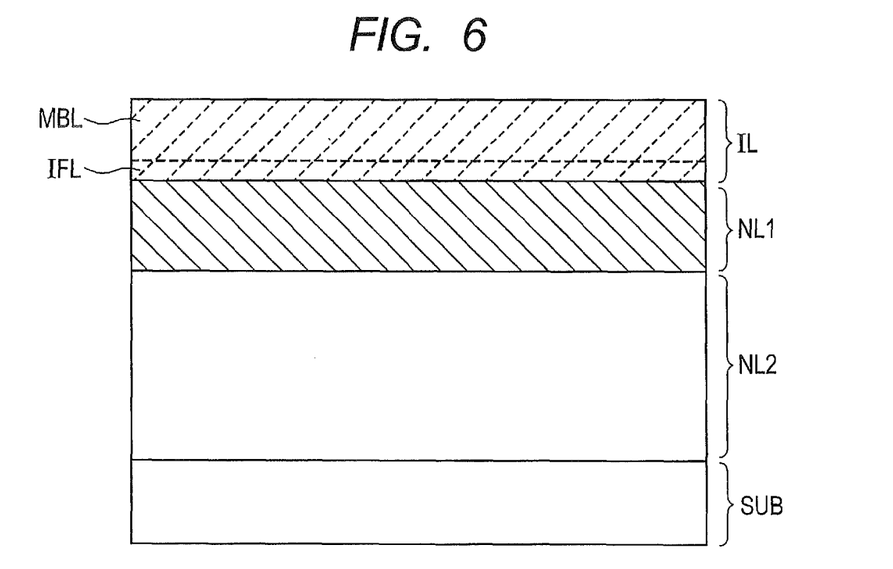
FIG. 6 is a cross-section view showing the configuration of a semiconductor device according to a second embodiment.

FIG. 6 is a cross-section view showing the configuration of a semiconductor device according to a second embodiment. The second embodiment is the same as the first embodiment except that the second embodiment includes a second nitride semiconductor layer NL2 between a substrate 10 and a first nitride semiconductor layer NL1.

The second nitride semiconductor layer NL2 is formed under the first nitride semiconductor layer NL1. In addition, the second nitride semiconductor layer NL2 forms a heterojunction with the first nitride semiconductor layer NL1. The second nitride semiconductor layer NL2 and the first nitride semiconductor layer NL1 are formed with materials that have electron affinities different from each other.

In this case, the first nitride semiconductor layer NL1 is, for example, an AlGaN layer or an AlInGaN layer, and the second nitride semiconductor layer LN2 is, for example, a GaN layer.

According to the second embodiment, advantageous effects that are the same as those of the first embodiment can be obtained.

In this case, two dimensional electron gas is generated at the interface between the first nitride semiconductor layer NL1 and the second nitride semiconductor layer NL2. Because the two dimensional electron gas is affected by band distributions in the vicinity of the interface between the first nitride semiconductor layer NL1 and the second nitride semiconductor layer NL2, there is a possibility that the two dimensional electron gas is decreased in accordance with interface states in the interface region between the adjacent first nitride semiconductor layer NL1 and an aluminum oxide layer IL. Therefore, according to the second embodiment, owing to the reduction of the number of interface states in the interface region between the first nitride semiconductor layer NL1 and the aluminum oxide layer IL, it can be suppressed for the two dimensional electron gas in the vicinity of the interface between the first nitride semiconductor layer NL1 and the second nitride semiconductor layer NL2 to be affected by the above-mentioned interface states.

Third Embodiment

Figure 7:
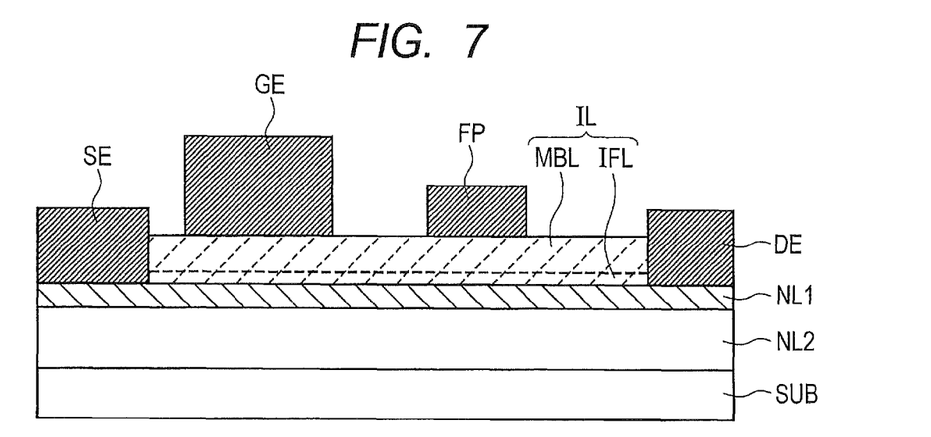
FIG. 7 is a cross-section view showing the configuration of a semiconductor device according to a third embodiment.

FIG. 7 is a cross-section view showing the configuration of a semiconductor device according to a third embodiment. The third embodiment is the same as the first embodiment or the second embodiment except that the semiconductor device according to the third embodiment forms a HEMT (High Electron Mobility Transistor).

The HEMT of the third embodiment is formed with the use of a hetrostructure shown in FIG. 6. As described above, the interface between a second nitride semiconductor layer NL2 and a first nitride semiconductor layer NL1 forms a heterojunction. In addition, the first nitride semiconductor layer NL1 functions as a supply layer for supplying two dimensional gas, and the second nitride semiconductor layer NL2 functions as a channel layer.

An aluminum oxide layer IL is formed over the first nitride semiconductor layer NL1. The aluminum oxide layer IL, which includes an interface layer IFL and a main body layer MBL, functions as a gate insulating film of the HEMT. A gate electrode GE is formed over the aluminum oxide layer IL.

The gate electrode GE is made of, for example, Al, Ti, TiN, W, WSi, or Ni formed by a PVD (Physical Vapor Deposition) method, or polysilicon formed by a CVD (Chemical Vapor Deposition) method.

A source electrode SE and a Drain electrode DE directly contact the upper surface of the first nitride semiconductor layer NL1.

The source electrode SE and the drain electrode DE face each other with the gate electrode GE therebetween. The aluminum oxide layer IL is not formed over parts of the surface of the first nitride semiconductor layer NL1 because the source electrode SE and the drain electrode DE are to be located over the parts. Therefore, the source electrode SE and the drain electrode DE are directly coupled with the first nitride semiconductor layer NL1.

The distance from the gate electrode GE to the drain electrode DE is longer than the distance from the gate electrode GE to the source electrode SE. Owing to this fact, the withstand voltage between the gate and the drain is strengthened. In addition, a field plate electrode FP is formed over the middle area of a part of the aluminum oxide layer IL between the gate electrode GE and the drain electrode DE. The same potential as that of the source electrode SE (for example, the earth potential) is applied to the field plate electrode FP. Therefore, the withstand voltage between the gate and the drain is more strengthened.

Figure 8A:
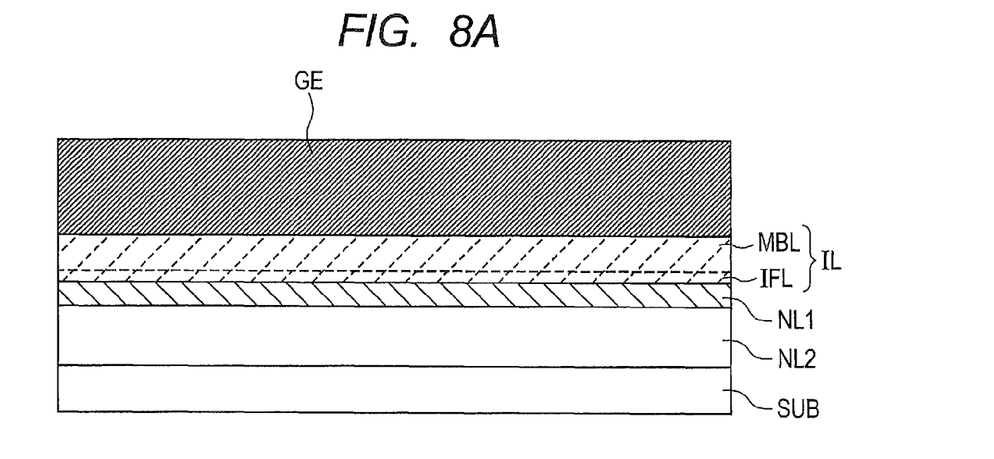
FIG. 8A and FIG. 8B are cross-section views showing a semiconductor device manufacturing method according to the third embodiment.
Figure 8B:
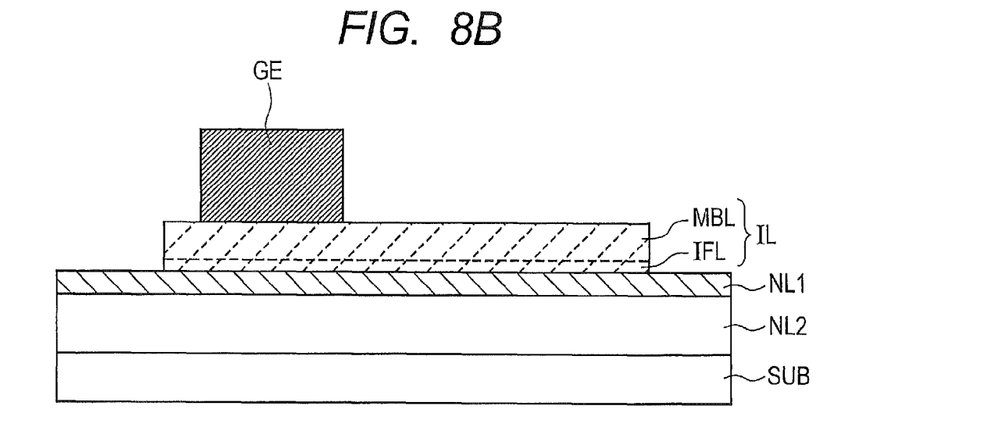

Next, a semiconductor device manufacturing method according to the third embodiment will be described with reference to FIG. 7, FIG. 8A, and FIG. 8B. FIG. 8A and FIG. 8B are cross-section views showing the semiconductor device manufacturing method according to the third embodiment.

First, a substrate 10, on which the second nitride semiconductor layer NL2 has been formed as shown in FIG. 8A, is prepared. Next, the first nitride semiconductor layer NL1 is formed over the second nitride semiconductor layer NL2. Next, the interface layer IFL and the main body layer MBL are formed over the first nitride semiconductor layer NL1. The above forming method is the same as that of the first embodiment.

Next, a conducting film, which is to be formed into the gate electrode GE, is formed over the aluminum oxide layer IL. This conducting film is formed with the use of, for example, a PVD method such as a sputtering method, or a CVD method.

Next, a resist pattern is formed over the conducting film which is to be formed into the gate electrode GE as shown in FIG. 8B, and this resist pattern is used as a mask to selectively remove parts of the conducting film. As a result, the gate electrode GE is formed. Subsequently, the resist pattern is removed.

Next, a resist pattern is formed over the gate electrode GE and the aluminum oxide layer IL, and this resist pattern is used as a mask to selectively remove parts of the aluminum oxide layer IL. The parts of aluminum oxide layer IL can be removed with the use of a hydrofluoric acid type solution. The above process is carried out in order to expose parts of the first nitride semiconductor layer NL1 to which the source electrode SE and the drain electrode DE are to be connected by removing the parts of the aluminum layer IL which cover the parts of the first nitride semiconductor layer NL1. Subsequently, the resist pattern is removed. However, a patterning method and a process sequence relating to the gate electrode GE and the aluminum oxide layer IL is not limited to the above-described examples.

Next, as shown in FIG. 7, conducting film is formed over the first nitride semiconductor layer NL1, over the aluminum oxide layer IL, and over the gate electrode GE, and then parts of this conducting film are selectively removed. As a result, the source electrode SE and the drain electrode DE are formed.

According to the third embodiment, even in the case of the semiconductor device forming the HEMT, advantageous effects that are the same as those of the first embodiment can be obtained.

In this case, the HEMT is used for a high withstand voltage device in which a high voltage is applied to its drain electrode DE. In the case where a high voltage is applied to the drain electrode DE, electrons are trapped not only at the interface between the first nitride semiconductor layer NL1 and the aluminum oxide layer IL just under the gate electrode GE, but also at the interface between the first nitride semiconductor layer NL1 and the aluminum oxide layer IL in the vicinity of the drain electrode DE. Therefore, there is a possibility that the ON-resistance of the HEMT at a high-voltage operation is larger than that of the HEMT at a low-voltage operation. To put it concretely, the drain current of the HEMT at a high-voltage operation is decreased. This phenomenon is referred to as a collapse phenomenon.

According to the third embodiment, as is the case of the first embodiment, the number of interface states in the interface region between the aluminum oxide layer IL, which is a gate insulating film, and the first nitride semiconductor layer NL1 is decreased. Therefore, in the HEMT according to the third embodiment, the above-mentioned collapse phenomenon can be suppressed.

In addition, the HEMT can function without the field plate electrode FP formed in this third embodiment. Conversely, the HEMT including plural field plate electrodes FP can also function.

Fourth Embodiment

Figure 9:
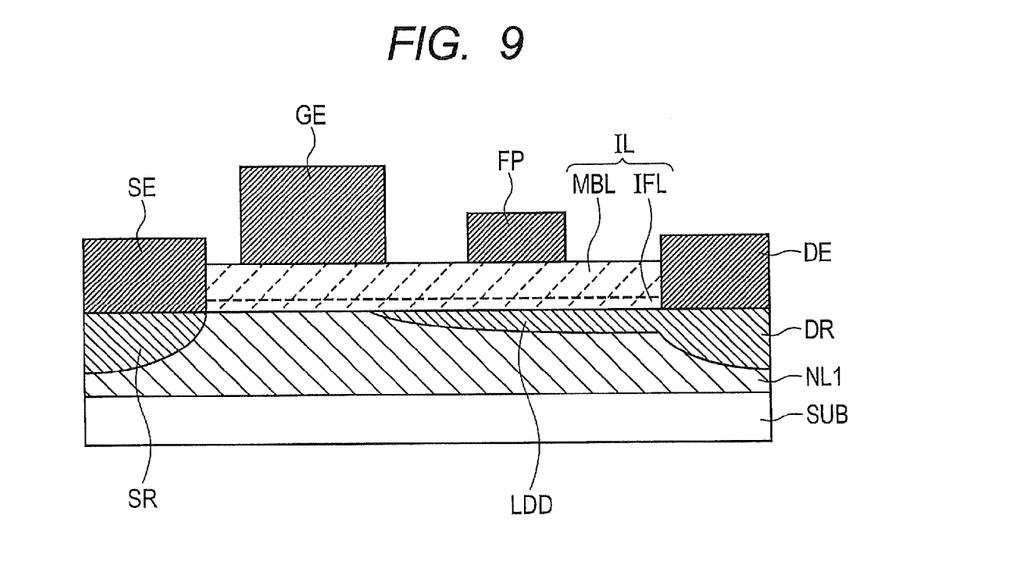
FIG. 9 is a cross-section view showing the configuration of a semiconductor device according to a fourth embodiment.

FIG. 9 is a cross-section view showing the configuration of a semiconductor device according to a fourth embodiment. The fourth embodiment is the same as the first embodiment except that a semiconductor device according to the fourth embodiment forms a MOSFET (Metal Oxide Semiconductor FET).

This FET is fabricated with the use of the layer structure shown in FIG. 1. In the fourth embodiment, a first nitride semiconductor layer NL1 is, for example, GaN.

In the first nitride semiconductor layer NL1, a source region SR, a drain region DR, and a low density diffusion region (referred to as an LDD region hereinafter) LDD are formed. The source region SR and the drain region DR face each other with an aluminum oxide layer therebetween in a planar view.

The LDD region contacts the drain region DR, and the LDD region DR is doped with impurities whose concentration is lower than that of the drain region DR.

The above regions are respectively formed by doping, for example, the first nitride semiconductor layer NL1 with impurities. These impurities are Si in the case of the source region SR, the drain region DR, and the LDD region LDD being set n-type, and these impurities are Mg in the case of the source region SR, the drain region DR, and the LDD region LDD being set p-type.

Here, as shown in FIG. 3, in the layer structure described in the first embodiment, the conspicuous generation of C-V humps can be suppressed as long as a gate voltage is positive. Therefore, the layer structure described in the first embodiment is especially effective in suppressing the generation of C-V humps as long as the source region SR and the drain region DR are dosed with n-type impurities (in other words, in the case of the semiconductor device being an re-channel type FET).

A source electrode SE is coupled to the source region SR, and a drain electrode DE is coupled to the drain region DR. In addition, a gate electrode GE and a field plate electrode FP are formed over the aluminum oxide layer IL. The layout including the source electrode SE, the gate electrode GE, the field plate FP, and drain electrode DE is, for example, the same as that employed in the third embodiment.

Figure 10A:
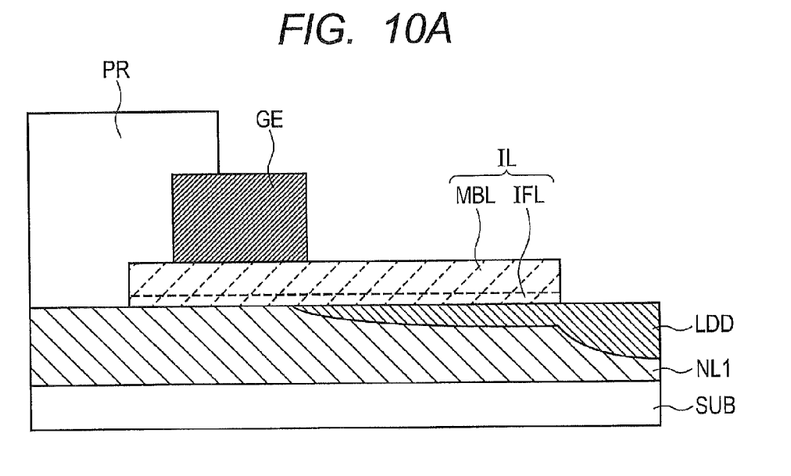
FIG. 10A and FIG. 10B are cross-section views showing a semiconductor device manufacturing method according to the fourth embodiment.
Figure 10B:
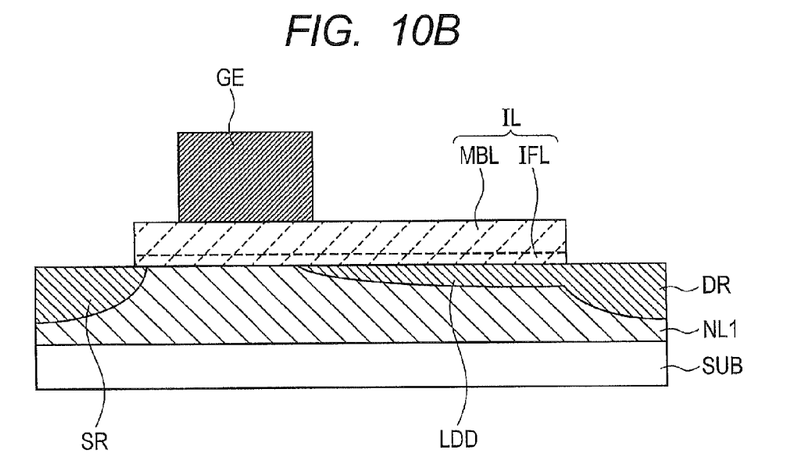

Next, a semiconductor device manufacturing method according to the fourth embodiment will be described with reference to FIG. 9, FIG. 10A, and FIG. 10B. FIG. 10A and FIG. 10B are cross-section views showing the semiconductor device manufacturing method according to the fourth embodiment.

First, as shown in FIG. 10A, the aluminum oxide layer IL is formed over the first nitride semiconductor layer NL1 as is the case with the first embodiment. Next, the gate electrode GE is formed over the aluminum oxide layer IL as is the case with the third embodiment. Next, parts of the aluminum oxide layer IL is selectively removed to form two openings (not shown) over which the source region and the drain region are to be formed.

Next, as shown in FIG. 10A, a resist pattern PR is formed, and impurities are introduced into the first nitride semiconductor layer NL1 using the resist pattern and the gate electrode GE as masks. As a result, the LDD region LDD is formed.

Subsequently, as shown in FIG. 10B, the resist pattern PR is removed. Next, impurities whose concentration is larger than that of the impurities introduced for forming the LDD region LDD are introduced into the first nitride semiconductor layer NL1 using the gate electrode GE and the aluminum oxide layer IL as masks. As a result, the source region SR and the drain region DR are formed.

Subsequently, the source electrode SE that contacts the source region SR and the drain electrode DE that contacts the drain region DR are formed.

According to the fourth embodiment, even in the case of the semiconductor device forming a MOSFET, advantageous effects that are the same as those of the first embodiment can be obtained. To put it concretely, in this MOSFET, the number of interface states in the interface region between the aluminum oxide layer IL, which is a gate insulating film, and the first nitride semiconductor layer NL can be decreased as is the case of the first embodiment. Therefore, in the MOSFET according to the fourth embodiment, the above-mentioned collapse phenomenon can be suppressed.

Although the present invention made by the inventors has been explained concretely on the basis of the above-described embodiments, the present invention is not limited by any of the details of the embodiments, and it is obvious that various modifications may be made in the present invention without departing from the spirit and scope thereof.

What is claimed is:
1. A semiconductor device comprising:
a first nitride semiconductor layer including Ga; and
an aluminum oxide layer that directly contacts an upper surface of the first nitride semiconductor layer,
wherein the aluminum oxide layer includes H atoms at least within a defined region from an interface with the first nitride semiconductor layer,
wherein a peak value of an H atom concentration in the defined region is in a range of $1\times10^{20}$ cm$^{-3}$ to $5\times10^{21}$ cm$^{-3}$,
wherein a thickness of the aluminum oxide layer is determined based on a voltage specification of said semiconductor device,
wherein the aluminum oxide layer includes amorphous states, and
wherein the relative permittivity of the aluminum oxide in the aluminum oxide layer is in a range of 6 to 8.

2. The semiconductor device according to claim 1, wherein the first nitride semiconductor layer comprises a GaN layer, an AlGaN layer, or an AlInGaN layer.

3. The semiconductor device according to claim 1, wherein the aluminum oxide layer comprises:
an interface layer that directly contacts the first nitride semiconductor layer, and has the peak value of the H atom concentration; and
a main body layer with which the interface layer is overlaid, and in which an H atom concentration is less than that in the interface layer.

4. The semiconductor device according to claim 3, wherein the peak value of the H atom concentration in the interface layer is greater than double a peak value of the H atom concentration in the main body layer.

5. The semiconductor device according to claim 1, wherein the aluminum oxide layer comprises a gate oxide film, and the semiconductor device further comprises a gate electrode formed over the aluminum oxide layer.

6. The semiconductor device according to claim 5, further comprising:
a source electrode and a drain electrode that contact the first nitride semiconductor and face each other with the gate electrode therebetween in a planar view; and
a field plate electrode that is formed over a region between the gate electrode and the drain electrode in the aluminum oxide layer,
wherein a distance between the gate electrode and the drain electrode is greater than a distance between the gate electrode and the source electrode.

7. The semiconductor device according to claim 5, further comprising: a source region and a drain region that are formed in the first nitride semiconductor layer, and face each other with the aluminum oxide layer therebetween.

8. The semiconductor device according to claim 7, wherein both the source region and the drain region are doped with an n-type impurity.

9. The semiconductor device according to claim 7, further comprising a low density diffusion region that contacts the drain region and is doped with impurities whose concentration is less than a concentration of impurities with which the drain region is doped.

10. The semiconductor device according to claim 1, further comprising a second nitride semiconductor layer that is formed under the first nitride semiconductor layer, and forms a heterojunction with the first nitride semiconductor layer.

11. The semiconductor device according to claim 10, wherein the first nitride semiconductor layer comprises an AlGaN layer or an AlInGaN layer and the second nitride semiconductor layer comprises a GaN layer.

12. The semiconductor device according to claim 1, wherein at least part of the H atoms are introduced in a form of hydroxyl groups.

13. The semiconductor device according to claim 1, wherein a film thickness of the aluminum oxide layer is in a range of 10 nm to 150 nm.

14. The semiconductor device according to claim 1, wherein the peak value of the H atom concentration in the defined region is in a range of $3\times10^{20}$ cm$^{-3}$ to $5\times10^{21}$ cm$^{-3}$.

15. The semiconductor device according to claim 1, wherein a number of hydroxyl groups in said aluminum oxide layer is greater than a number of Aluminum-Hydrogen (Al—H) bonds in said aluminum oxide layer.

16. The semiconductor device according to claim 1, wherein the defined region is within a range of 1 nm to 10 nm from an interface between the aluminum oxide layer and the first nitride semiconductor layer.

17. The semiconductor device according to claim 1, wherein the defined region is within a range of 2 nm to 8 nm from an interface between an interface layer of the aluminum oxide layer and the first nitride semiconductor layer, and
    wherein the peak value of an H atom concentration in the defined region is $5\times10^{21}$ cm$^{-3}$.

\* \* \* \* \*